(12) United States Patent
Wakayanagi et al.

(10) Patent No.: US 9,885,107 B2
(45) Date of Patent: Feb. 6, 2018

(54) METHOD FOR CONTINUOUSLY FORMING NOBLE METAL FILM AND METHOD FOR CONTINUOUSLY MANUFACTURING ELECTRONIC COMPONENT

(71) Applicant: CANON ANELVA CORPORATION, Kawasaki-shi (JP)

(72) Inventors: Shunichi Wakayanagi, Kawasaki (JP); Eisaku Watanabe, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 724 days.

(21) Appl. No.: 14/367,295

(22) PCT Filed: Dec. 10, 2012

(86) PCT No.: PCT/JP2012/081884
§ 371 (c)(1),
(2) Date: Jun. 20, 2014

(87) PCT Pub. No.: WO2013/099570
PCT Pub. Date: Jul. 4, 2013

(65) Prior Publication Data
US 2015/0329956 A1    Nov. 19, 2015

(30) Foreign Application Priority Data
Dec. 27, 2011 (JP) .................. 2011-284947

(51) Int. Cl.
C23C 14/00    (2006.01)
C23C 14/14    (2006.01)
(Continued)

(52) U.S. Cl.
CPC .......... C23C 14/14 (2013.01); C23C 14/0036 (2013.01); C23C 14/34 (2013.01);
(Continued)

(58) Field of Classification Search
CPC ..... C23C 14/14; C23C 14/0036; C23C 14/34; C23C 14/351; C23C 14/56; H01J 37/32477; H01J 37/34; H01J 37/3426
See application file for complete search history.

(56) References Cited

U.S. PATENT DOCUMENTS 5,173,449 A * 12/1992 Lorenzen .......... H01L 21/28568
148/DIG. 20
6,670,668 B2    12/2003 Wendt
(Continued)

FOREIGN PATENT DOCUMENTS

CN    101923054 A    12/2010
JP    2002-524850 A    8/2002
(Continued)

OTHER PUBLICATIONS

International Preliminary Report on Patentability and Written Opinion issued in PCT/JP2012/081884, dated Jul. 1, 2014 (5 pages).
(Continued)

Primary Examiner — John Brayton
(74) Attorney, Agent, or Firm — Fitzpatrick, Cella, Harper & Scinto

(57) ABSTRACT

The purpose of the present invention is to prevent a drop in secondary electron emission characteristics due to the inside wall of a chamber being covered by a noble metal film continuously formed by plasma sputtering, and so generate and maintain the plasma. After a noble metal film is formed on a given substrate and before a film is formed on a subsequent substrate, a secondary electron emission film comprising a material having a secondary electron emission coefficient higher than that of the noble metal is formed on the inner wall of the chamber.

7 Claims, 5 Drawing Sheets

(51) Int. Cl.
*C23C 14/34* (2006.01)
*C23C 14/35* (2006.01)
*C23C 14/56* (2006.01)
*H01J 37/34* (2006.01)
*H01J 37/32* (2006.01)

(52) U.S. Cl.
CPC ............ *C23C 14/351* (2013.01); *C23C 14/56* (2013.01); *H01J 37/32477* (2013.01); *H01J 37/34* (2013.01); *H01J 37/3426* (2013.01)

(56) References Cited

U.S. PATENT DOCUMENTS

| | | | |
|---|---|---|---|
| 7,602,111 | B2 | 10/2009 | Lee |
| 8,278,211 | B2 | 10/2012 | Hirayama et al. |
| 2008/0023653 | A1 | 1/2008 | Lee et al. |
| 2008/0264776 | A1* | 10/2008 | Siller .................. C23C 14/0641 204/192.17 |
| 2010/0206715 | A1 | 8/2010 | Hiromi et al. |

FOREIGN PATENT DOCUMENTS

| | | |
|---|---|---|
| JP | 2007-27098 A | 2/2007 |
| JP | 2008-28360 A | 2/2008 |
| JP | 2010-209463 A | 9/2010 |

OTHER PUBLICATIONS

International Search Report issued in PCT/JP2012/081884, dated Mar. 19, 2013 (1 page).
Office Action dated Jun. 25, 2015 issued in Chinese Application No. 201280064719.0 (3 pages).

\* cited by examiner

METHOD FOR CONTINUOUSLY FORMING NOBLE METAL FILM AND METHOD FOR CONTINUOUSLY MANUFACTURING ELECTRONIC COMPONENT

TECHNICAL FIELD

The present invention relates to a method for continuously forming a noble metal film, where a process for forming a noble metal, film on a substrate by sputtering is continuously performed, and a method for continuously manufacturing electronic components using the method concerned.

BACKGROUND ART

Many noble metal materials are used in a metal wiring in a semiconductor device. The noble metal material is defined as a generic term of groups 10 and 11 in the periodic table. Particularly, gold, platinum, or the like is formed as a functional material by a sputtering method (hereinafter also referred to as "sputtering") due to its productivity and easiness. In Patent Literature 1, for example, platinum film-formed by sputtering is used in an electrode. As sputtering, plasma sputtering using plasma is widely used.

The behavior of particles during the plasma sputtering will be explained using FIG. 4. The plasma during sputtering includes ions of a gas introduced as a discharge gas and a metal ion 603 emitted from a target 608. These ions 603 are accelerated by an electric field and enter the target 608 attached to a cathode 601, and a secondary electron 604 is emitted on a surface of the target 608. Since some ions 603 have a momentum obtained by, for example, particle collision, they collide against an inner wall of a discharge space. In a common sputtering apparatus, in order to prevent a chamber inner wall of the discharge space from being covered by sputtering particles, a deposition preventive board 602 is provided to be mounted inside the chamber inner wall; therefore, the inner wall of the discharge space may be referred to as a surface of the deposition preventive board 602. Also on the surface of the deposition preventive board 602, the secondary electron 604 is emitted by the collision of the ion 603 as on the surface of the target 608, and the plasma is maintained by electrons continuously supplied from each surface of the target 608 and the deposition preventive board 602.

PRIOR ART REFERENCE

Patent Literature

Patent Literature 1: Japanese Patent Application Laid-open No. 2002-524850

SUMMARY OF THE INVENTION

Problem to be Solved by the Invention

Before the deposition preventive board 602 is installed in the chamber of the sputtering apparatus, a natural oxide film 605 is formed on the surface of the deposition preventive board 602, as shown in FIG. 4, or blast processing or thermal spraying processing using a metal material as surface treatment is applied onto the surface of the deposition preventive board 602. Thus, the surface of the deposition preventive board 602 has a high secondary electron emission coefficient, and plasma is easily generated or maintained in the state immediately after the new deposition preventive board 602 is installed.

Meanwhile, when film formation is progressed, a target material is deposited on the surface of the deposition preventive board 602; however, in common spattering using common metal other than noble metal atoms, a gas staying in a vacuum chamber causes oxidation or nitriding on a metal surface covering the surface of the deposition preventive board 602, and an emission characteristic of secondary electrons on the surface of the deposition preventive board 602 is maintained.

However, in the noble metal atoms, surface alteration hardly occurs due to its chemical stability. Thus, when film formation of noble metal is continued, a noble metal covering film 606 is formed on the surface of the deposition preventive board 602, a shown in FIG. 5, and the secondary electron emission coefficient on the surface of the deposition preventive board 602 is significantly reduced, so that it is considered that it is difficult to generate or maintain plasma. Thus, in a sputtering apparatus continuously forming a noble metal film, a maintenance operation such as exchange of a deposition preventive board is required, so that the productivity is significantly reduced. In particular, it is considered that such a problem becomes remarkable in the case, for example, in which, in order to form a noble metal film at a high film formation rate, the formation of only the noble metal film is performed in one chamber by using concurrent sputtering using one large noble metal target or a plurality of noble metal targets.

In view of the above problem, an object of the present invention is to provide a method for continuously forming a noble metal film, where stable film formation can be continuously performed for a long time, and a method for continuously manufacturing an electronic component, to which the method concerned is applied.

Means for Solving the Problem

The first present invention is a method for continuously forming a noble metal film in which a process of carrying a substrate into a chamber, forming a film made of noble metal on the substrate by plasma sputtering in the chamber, and then carrying the substrate out of the chamber is continuously performed for a plurality of substrates. In this method, for a period from when an arbitrary substrate formed with the film made of noble metal is carried out from the chamber till when a substrate to be film-formed subsequently is carried into the chamber, a secondary electron emission covering film made of a material having a secondary electron emission coefficient higher than that of the noble metal is formed on an inner wall surface of the chamber.

The second present invention is a method for continuously forming an electronic component provided with a noble metal film as a member, and in this method, the noble metal film is formed by a method for continuously forming a noble metal film according to the above first present invention.

Effects of the Invention

According to the present invention, in continuous formation of a noble metal film by plasma sputtering, plasma can be stably generated, so that the productivity can be further enhanced. Accordingly, an electronic component provided with a noble metal film can be manufactured with high productivity.

MODE FOR CARRYING OUT THE INVENTIONS

In the present invention, in an inner wall of a chamber on which a noble metal film is deposited, a secondary electron emission covering film having a secondary electron emission coefficient higher than that of the noble metal is deposited on the noble metal covering film, whereby plasma is easily generated and maintained. In the present invention, the secondary electron emission coefficient means the ratio of secondary electrons emitted from a sample to the number of electrons entering the sample. Further, in the present invention, when a deposition preventive board is installed in the chamber, the inner wall of the chamber means a wall surface on a substrate side of the deposition preventive board.

Figure 4:
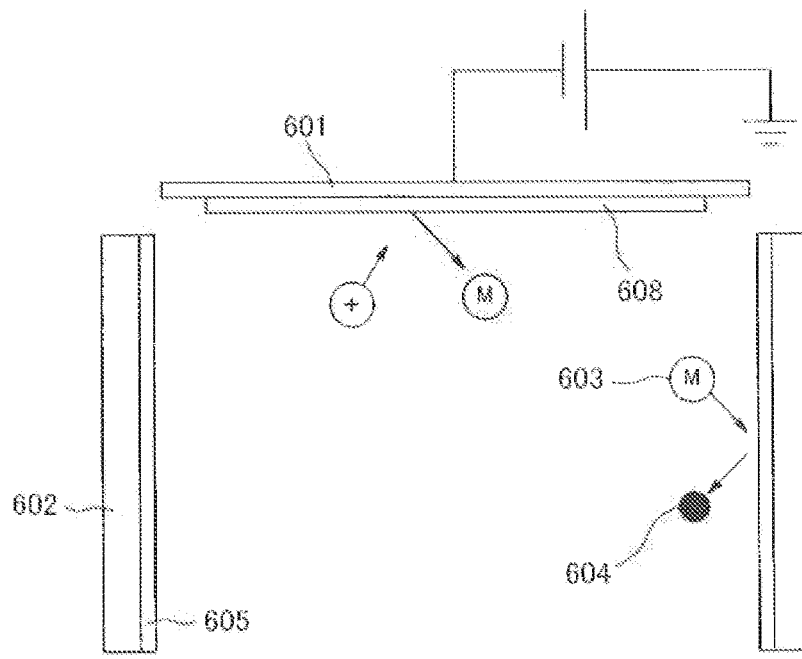
FIG. 4 is a view for explaining behavior of particles and electrons during plasma spattering.
Figure 5:
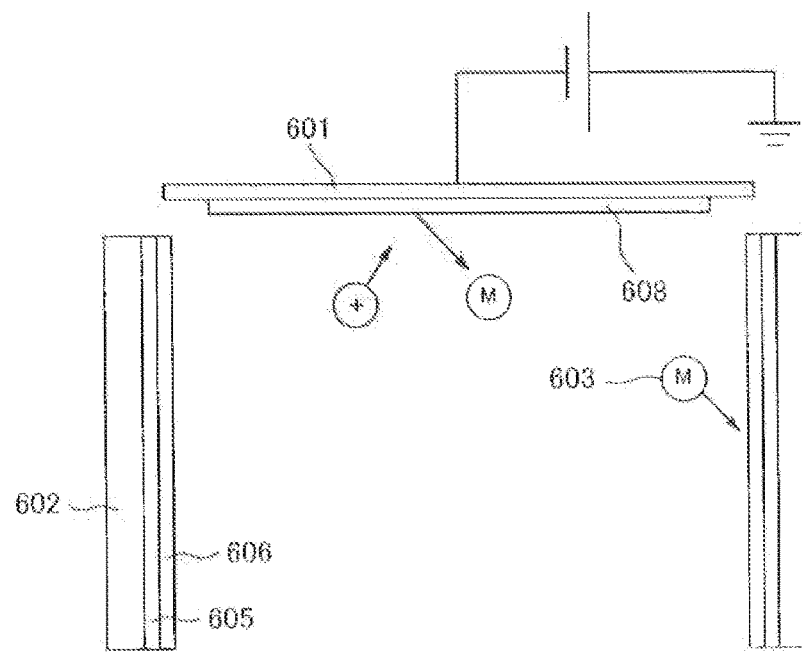
FIG. 5 is a view for explaining a problem according to the present invention.
Figure 6:
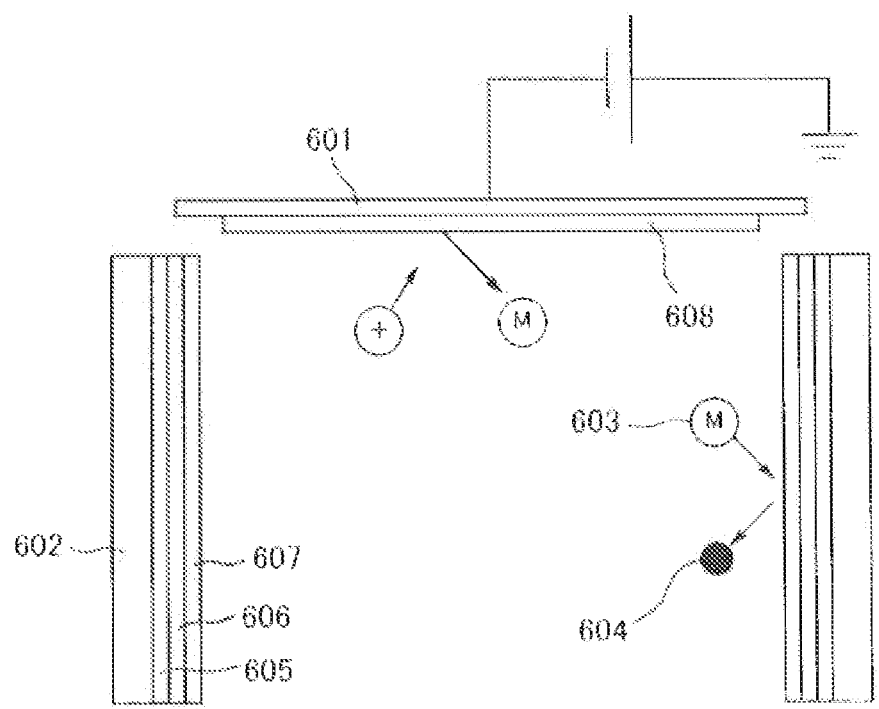
FIG. 6 is a view for explaining behavior of particles and electrons during plasma sputtering in the present invention.

FIG. 6 shows a state in which a secondary electron emission covering film is formed on an inner wall surface of a deposition preventive board. In FIG. 6, reference numeral 607 is a secondary electron omission covering film, and the same members as those of FIGS. 4 and 5 are denoted by the same reference numerals. As shown in FIG. 6, after formation of the secondary electron emission covering film 607, when a noble metal target is sputtered again, secondary electrons enough to generate or maintain plasma are emitted.

In the present invention, examples of a method for forming a secondary electron emission covering film, includes a method for forming a secondary electron emission covering film on a noble metal covering film by sputtering or vapor deposition, using a material having a secondary electron emission coefficient higher than that of the noble metal covering film deposited on a chamber inner wall and a method of introducing reactive gas such as oxygen gas and nitrogen gas into a chamber, chemically reacting the noble metal covering film with the reactive gas using plasma, and thereby forming a secondary electron emission covering film.

Hereinafter, although embodiments of the present invention will be described with reference to the drawings, the present invention is not limited to the embodiments. In the drawings to be explained below, the same functional components are denoted by the same reference numerals, and the repeated description thereof may be omitted.

First Embodiment

Figure 1:
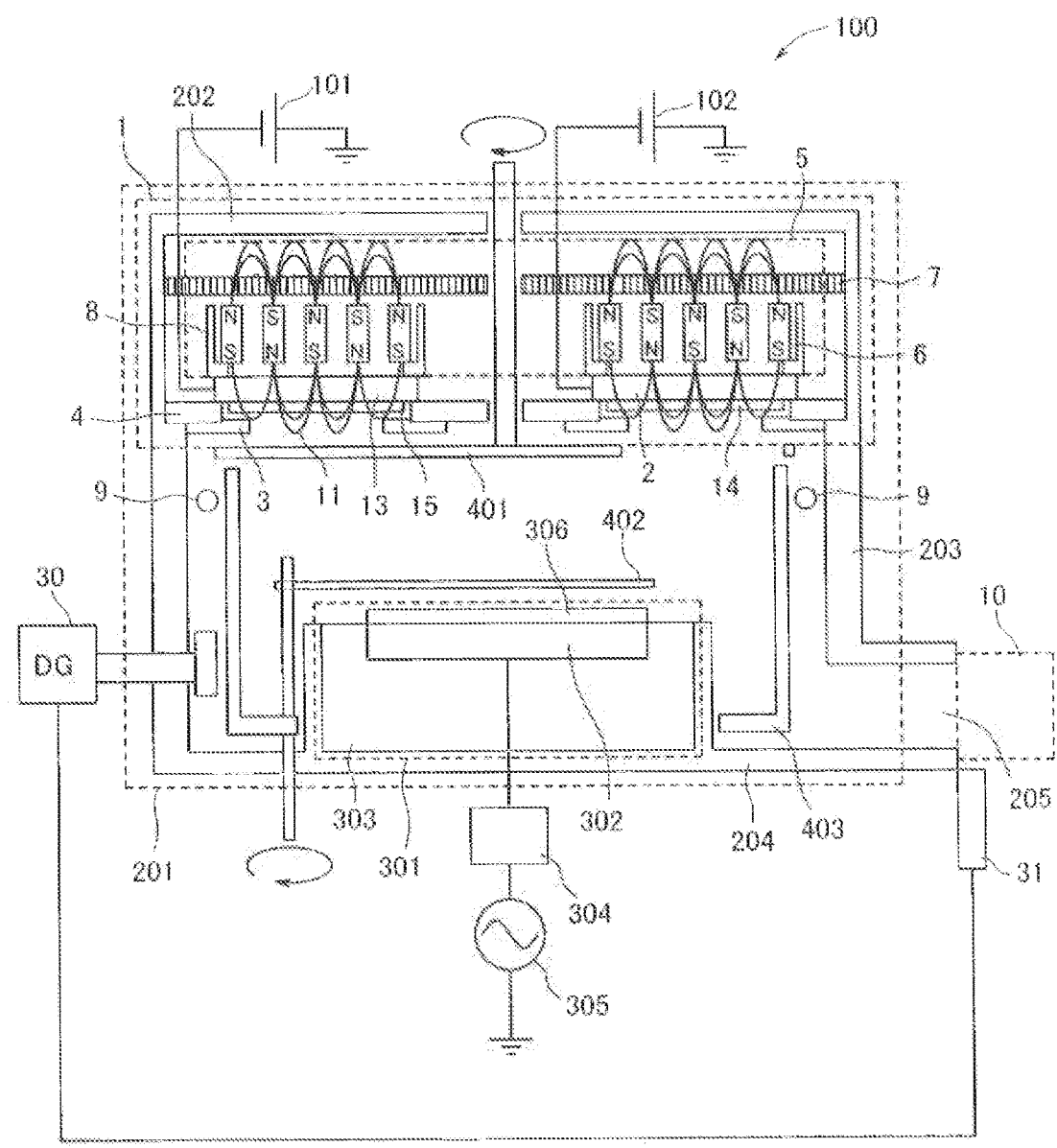
FIG. 1 is a view showing a configuration of a sputtering apparatus in which a first embodiment of the present invention is practiced.

As a first embodiment of the present invention, an example in which a secondary electron emission covering film made of a material having a secondary electron emission coefficient higher than that of noble metal as a film forming material is deposited on an inner wall surface of a chamber by sputtering will be explained using FIG. 1 schematically showing a configuration of a sputtering apparatus capable of carrying out this embodiment.

As shown in FIG. 1, a sputtering apparatus 100 of this example is provided with a container (chamber) 201 partitioning a processing space. An upper electrode (discharge electrode) 1 and a rower electrode (bias electrode) 301 are provided in upper and lower portions of the chamber 201.

The chamber 201 is a hollow cylindrical container and is constituted of a substantially disk-shaped upper wall (coiling wall) 202, a substantially cylindrical side wall 202, and a substantially disk-shaped bottom wall 204. A holder 302 as a placement table holding a substrate 306 of an electronic component or the like as a processed body is provided under the processing space partitioned in the chamber 201.

The chamber 201 has an exhaust outlet 205 provided on the side wall, and the exhaust outlet 205 is connected to an exhaust pump 10 evacuating the inside of the chamber 201. Further, the chamber 201 has, on its inner wall, a gas introduction port 9 introducing processing gas such as argon into the processing space in the chamber 201, and she gas introduction port 3 is connected to gas supply means (not shown).

Furthermore, a side wall of the chamber 201 has a pressure gauge 20 for measuring the pressure in the chamber 201. The pressure gauge 30 is constituted of a diaphragm gauge and the like, and connected to an auto pressure controller (AFC) 31 controlling the pressure in the chamber 201 bussed on a detected value obtained by the pressure gauge 30.

The upper electrode (discharge electrode) 1 is constituted of an upper wall 202, a magnet, mechanism 5, target electrodes 2 and 13, and an insulating body 4. The magnet, mechanism 5 is provided under the upper wall 202, and the target electrodes 2 and 13 loaded with a target material are provided at a lower portion of the magnet mechanism 5. Main components of the target electrodes 2 and 13 are made of nonmagnetic metal such as Al, austenitic stainless steel (SUS), and Cu.

A noble metal target as a first target 14 required for film formation on the substrate 306 is installed on the decompression side of she first target electrode 2. Meanwhile, a second target 15 having a secondary electron emission coefficient higher than that of the first target 14 is installed on the second target electrode 13. As she second target 15, Al or Ti is selected, for example.

The target electrodes 2 and 13 are connected to DC power sources 101 and 102 supplying DC voltage. The insulating body 4 insulates the target electrodes 2 and 13 from the side wall of the chamber 201 and, at the same time, holds the target electrode 2 and 13 in the chamber 201.

The upper electrode 1 and the target electrodes 2 and 13 include pipes (not shown) and can be cooled by flowing cooling water into the pipes.

The magnet mechanism 5 is constituted of a magnet supporting plates 7, a plurality of magnet pieces 6 supported by the magnet supporting plates 7, and magnetic bodies 8 for magnetic field adjustment provided on the outermost peripheral side of the magnet pieces 6. The magnet mechanism 5 is configured rotatably by a rotating mechanism (not shown) with the central axis of a target material as the rotation axis.

The plurality of magnet pieces 6 are provided above the target electrodes 2 and 13 and mutually adjacently arranged parallel to the surfaces of the target electrodes 2 and 13. A magnetic field 11 is formed by the adjacent magnet pieces 6.

The magnetic bodies 8 for magnetic field adjustment extend to partially overlap the magnet pieces a located on the outer peripheral side on the target electrodes 2 and 13. According to this constitution, the magnetic field strength can be suppressed (controlled) in a gap between the target electrodes 2 and 13 and a shield 3.

The lower electrode (bias electrode) 301 is constituted of the holder 303, a cooling/heating mechanism (not shown), a bottom wall 204, and an insulating body 303 for second electrode. The holder 302 on which the substrate 306 is placed includes the cooling/heating mechanism.

The insulating body 303 for lower electrode is a device for electrically insulating and supporting the holder 302 and the bottom wall 204 of she chamber 201. The holder 302 is connected to a power source 305 for lower electrode such as a high-frequency power source, applying bias power to the substrate 306, through a matching device 304. The power source 305 for lower electrode is provided with a power control mechanism (not shown) controlling the bias power applied to the holder 302.

A target shutter 401 is installed under the target electrodes 2 and 13 to shield the target, electrodes 2 and 13. The target shutter 401 has a structure of a rotary shutter. The target shutter 401 functions as a shielding member for attaining a closed state (shielding state) for shielding between the holder 302 and the target electrodes 2 and 13 or an open state (retraction state) for opening between the holder 302 and the target electrodes 2 and 13. The target shutter 401 is provided with a target shutter driving mechanism (not shown) for performing opening and closing operation of the target shutter 401.

The chamber 201 includes a substrate shutter 402 provided between the holder 302 and the target electrodes 2 and 13 and a substrate shutter driving mechanism (not shown) driven opening and closing of the substrate shutter 402. The substrate shutter 402 is disposed above the holder 302 and functions as a shielding member for attaining the closed state for shielding between the holder 302 and the target electrodes 2 and 13 or the open state for opening between the holder 302 and the target electrodes 2 and 13.

The chamber 201 includes a deposition preventive board 403 in order to prevent constituent members from being covered by sputtering particles.

Next, processing procedure according to the present invention will be described.

A first processing is a processing for forming a noble metal film onto the substrate 306 using the first target 14. First, the inside of the chamber 201 is evacuated by the exhaust pump 10. After the inside of the chamber 201 has been satisfactorily evacuated, the substrate 306 is carried into the chamber 201 and installed on the holder 302. Subsequently, an inert gas (e.g., Ar) is introduced at a predetermined flow rate through the gas introduction port 9, and, at the same time, the magnet mechanism 5 rotates at a predetermined rotational speed.

At that time, the substrate 306 is electrostatically attracted by voltage applied to an electrostatic attraction device (not shown). The temperature of the substrate 306 is adjusted to a predetermined temperature by a cooling/heating mechanism (not shown) contained within the holder 302 based on a substrate temperature measuring instrument (not shown).

The pressure control mechanism 31 is controlled based on a detected value obtained by the pressure gauge 30, and, at the same time, the flew rate of the gas introduced into the chamber 201 through the gas introduction port 9 is controlled, whereby the pressure in the chamber 201 is maintained at a desired pressure.

Voltage is applied to the first target electrode 2 by using the DC power source 102, whereby Ar ions strike the noble metal, target to start sputtering film formation. At this time, the target shutter 401 brings the first target 14 side into the open state, and when the substrate shutter 402 is in the open state, film formation processing is applied to the substrate 306. The target shutter 401 prevents the noble metal covering film from being adhered to the second target 15 not in use in this stage. After the sputtering film formation has been performed for a predetermined time, the electric power applied to the DC power source 102 is stopped.

After the processing for forming the noble metal film onto the substrate 306 has been terminated, the substrate 306 is carried out from the chamber 201.

As described above, when film formation using the noble metal target is progressed, the deposition preventive board 403 is covered by the noble metal covering film which is a target material. When tire deposit ion preventive board 403 is uniformly covered by the noble metal covering film, the secondary electron emission coefficient on the surface of the deposition preventive board 403 is reduced, so that it is difficult to generate or maintain plasma. Accordingly, a second processing is performed.

The second processing is processing for forming a secondary electron emission covering film onto the surface of the deposition preventive board 403 using the second target 15. Prior to the secondary electron emission covering film formation processing, the substrate 306 formed with the noble metal film is taken out, and the substrate shutter 402 is brought into the closed state. The substrate shutter 402 serves to protect the holder 302 from the film formation processing with the second target 15.

Subsequently, a discharge gas is introduced through the gas introduction port 9. In this example, although an inert gas is used as the discharge gas for example of explanation, when nitrogen and oxygen generally used in sputtering or a mixed gas of nitrogen, oxygen, and an inert gas is introduced, reactive sputtering using the second target 15 can be performed, and a nitride film or an oxide film considered to generally have a high secondary electron emission coefficient can be formed. The kind of gas to be used should be selected in consideration of the second target 15 and is not limited at all within the scope of the invention. The pressure of the discharge gas introduced through the gas introduction port 9 is maintained at a predetermined pressure by controlling the pressure control mechanism 31 likewise.

Next, an opening of the target shutter 401 is switched to bring the second target 15 side into the open state. In this state, voltage is applied to the target electrode 13 by using the DC power source 101, whereby the Ar ions strike the second target 15 to start sputtering film formation. The deposition preventive board 403 is covered with some of emitted particles by sputtering of the second target 15, and the secondary electron emission covering film (reference numeral 607 of FIG. 6) is formed.

At that time, as the secondary electron emission covering film, the material of the second target 15 is selected so as to obtain the secondary electron emission coefficient higher than chat of the noble metal film. Accordingly, after the formation of the secondary electron emission covering film, when the noble metal target is sputtered again, sufficient secondary electrons to generate or maintain plasma, are emitted.

Afterward, the formation of the secondary electron emission covering film is performed periodically, whereby stable film formation can be performed over time without causing the above problems; therefore, the maintenance cycle can be extended.

Since a deposition amount of the noble metal covering film deposited on the deposition preventive board 403 is proportional to integrated consumption of the first target 14, a cycle for covering the surface of she deposition preventive board 403 with the secondary electron emission covering film can be easily predicted. Namely, the secondary electron emission covering film is formed in a state that the substrate 306 is carried out for each formation of the noble metal films on a certain number of substrates 306, whereby the noble metal films can be continuously formed without causing problems.

In FIG. 1, although a DC sputtering apparatus is used as an example, in the object of the present invention, examples of a discharge method include RF sputtering and DC pulse sputtering, and the embodiments thereof are not limited.

Figure 2:
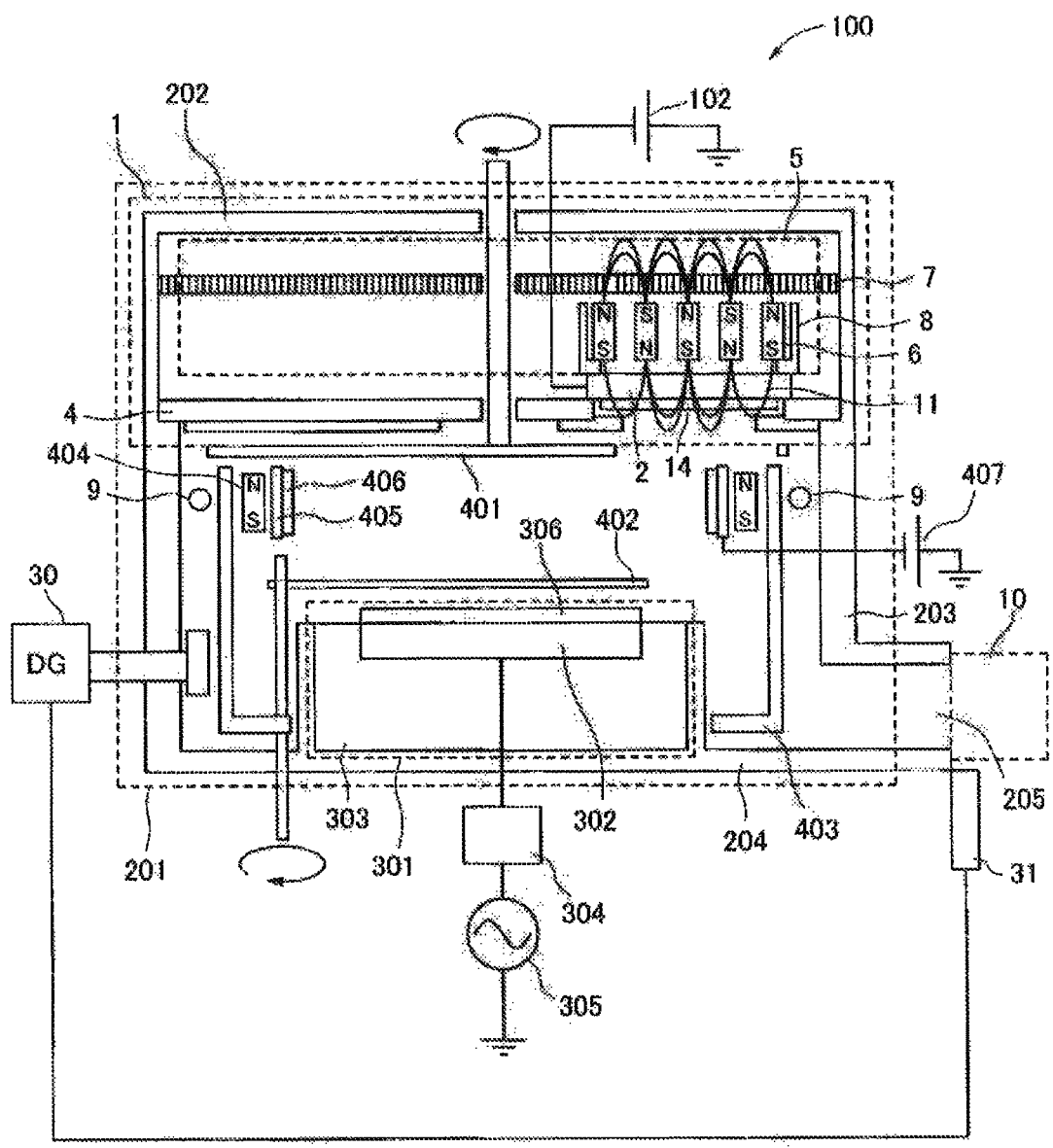
FIG. 2 is a view showing another configuration of the sputtering apparatus in which the first embodiment of the present invention is practiced.

In the sputtering apparatus exemplified in FIG. 1, although the second target 15 is illustrated in parallel with the first target 14 composed of noble metal atoms, it is not limited thereto, and in this embodiment, as shown in FIG. 2, the second target electrode 405 and the second target 406 are installed in a space constituted of the deposition preventive board 403. In FIG. 2, reference numeral 404 is a magnet piece, and reference numeral. 407 is a DC power source.

According to the constitution, of FIG. 2, the secondary electron emission covering film can be formed on the deposition preventive board 403 for a short time in comparison with the sputtering apparatus of FIG. 1. A procedure for forming the secondary electron emission covering film is similar to the constitution in FIG. 1.

Second Embodiment

Figure 3:
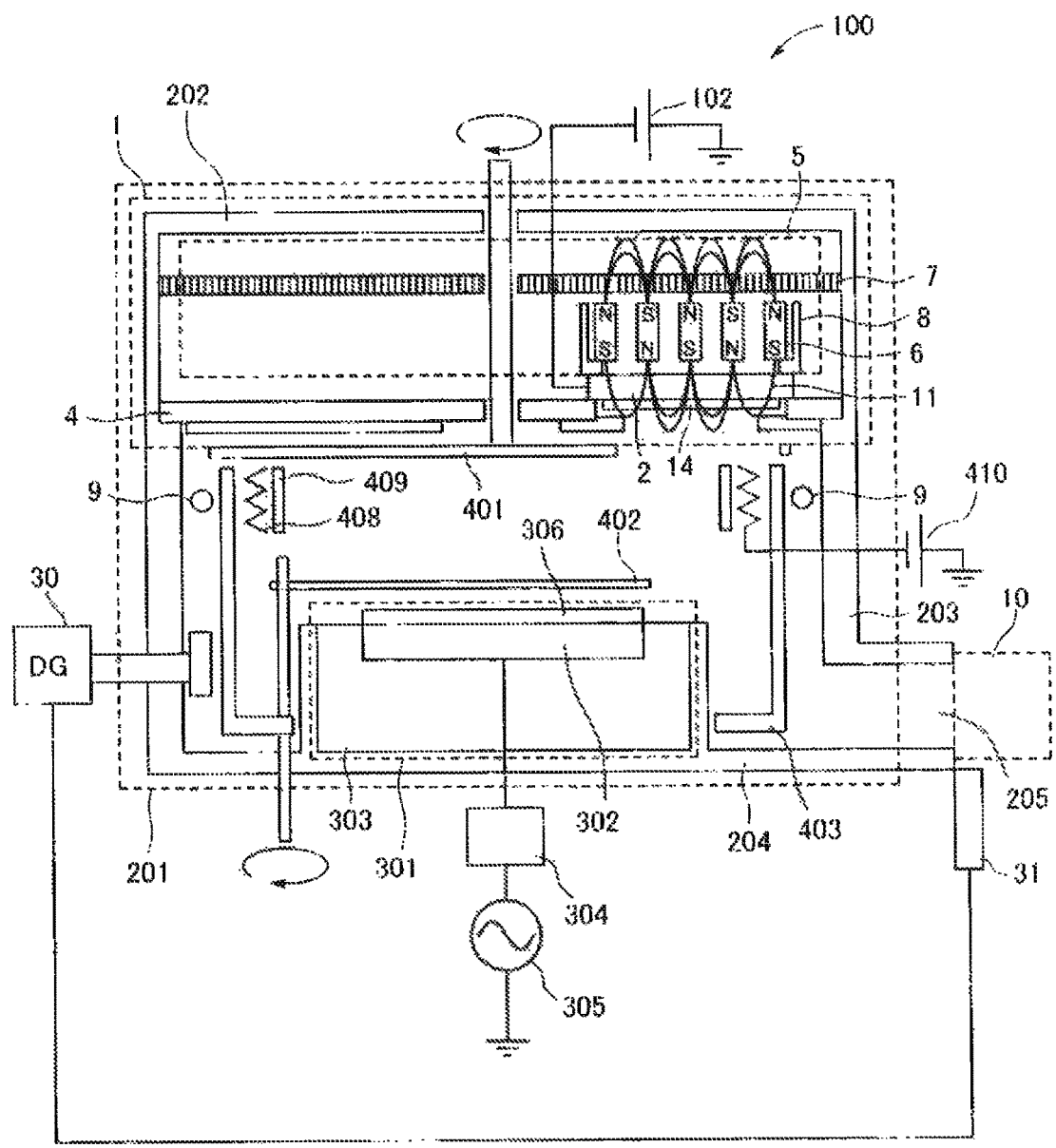
FIG. 3 is a view showing a configuration of a sputtering apparatus in which a second embodiment of the present invention is practiced.

In the above embodiment, although sputtering is exemplified as means for forming a secondary electron emission covering film, the present embodiment describes an example in which the secondary electron emission covering film is formed by vapor deposition. FIG. 3 is a view schematically showing a configuration of a sputtering apparatus capable of carrying out this embodiment and having a vapor deposition source through resistance heating. As a material to be used in the vapor deposition, a material in which the secondary electron coefficient of a covering film formed by vapor deposition or a covering film obtained by reacting the formed covering film with moisture and oxygen in the device is higher than that of the noble metal covering film is used. As the vapor deposition source, magnesium, aluminum, zinc, or the like is used.

In the device of FIG. 3, a heater 408 provided to be mounted is energized to thereby evaporate a vapor deposition material 409, and the secondary electron emission covering film can be formed by a method similar to the above method. Reference numeral 410 in FIG. 3 is a heater power source.

Third Embodiment

In this embodiment, such reactive gas as oxygen gas and nitrogen gas is introduced into the chamber 201 of the sputtering apparatus of FIG. 1, and a noble metal covering film deposited on the surface of the deposition preventive board 403 is chemically reacted with oxygen plasma, nitrogen plasma, or the like without using the second target 15, whereby a secondary electron emission covering film is formed. Since the noble metal covering film is chemically stable, such chemical reaction as oxidation and nitriding hardly occurs; however, the chemical reaction can be promoted by exposing the noble metal covering film to plasma. Since the secondary electron emission coefficient of the noble metal covering film as a compound is higher than a single noble metal covering film, the subsequent plasma generation can be stably performed.

In the above embodiments, a substrate is conveyed to a processing chamber and placed on a substrate holder provided in each processing chamber. However, the present invention is not limited thereto and can be used in a so-called in-line type device and the like in which a carrier loaded with a substrate is conveyed in each chamber in sequence. In an in-line type sputtering apparatus, when a secondary electron emission covering film is formed, a substrate may not be loaded on a carrier conveyed in a chamber for the secondary electron emission covering film formation period.

The secondary electron emission covering film may be formed after each processing of a single substrate or after the processing of a plurality of substrates, and this can be suitably selected depending on a film thickness of a noble metal material film-formed on the substrate.

Hereinabove, the above method for continuously forming a noble metal film according to this invention can be used in a method for continuously manufacturing various electronic components provided with a noble metal film as a member. Examples of such electronic components include a resistance change memory (ReRAM), a phase change memory (PRAM), and a light-emitting diode.

EXPLANATION OF REFERENCE NUMERALS

1: upper electrode, 2: first target electrode, 3: shield, 4: insulating body, 5: magnet mechanism, 6: magnet piece, 7: magnet supporting plate, 8: magnetic body for magnetic field adjustment, 9: gas introduction port, 10: exhaust pump, 11: magnetic field, 13: second target electrode, 14: first target, 15: second target, 30: pressure gauge, 31: auto pressure controller (APC), 100: sputtering apparatus, 101: DC power source, 102: DC power source, 201: container (chamber), 202: upper wall, 203: side wall, 204: bottom wall, 205: exhaust outlet, 301: lower electrode, 302: holder, 303: insulating body for lower electrode, 304: matching device, 305: power source for lower electrode, 306: substrate, 401: target shutter, 402: substrate shutter, 403: deposition preventive board, 404: magnet piece, 405: second target electrode, 406: second target, 407: DC power source, 408: heater, 409: vapor deposition material, 410: heater power source, 601: cathode, 602: deposition preventive board, 603: metal ion, 604: secondary electron, 605: natural oxide film, 606: noble metal covering film, 607: secondary electron emission covering film, 608: target

The invention claimed is:
1. A method for continuously forming a film made of a noble metal comprising the steps of:
   carrying a substrate into a chamber;
   forming only the film made of the noble metal on the substrate by plasma sputtering in the chamber; and then
   during a period from when the substrate is carried out from the chamber after film formation to when another substrate upon which the film made of the noble metal is to be formed subsequently is carried into the chamber, forming on an inner wall surface of the chamber a secondary electron emission covering film made of a material having a secondary electron emission coefficient higher than that of the noble metal.

2. The method according to claim 1, wherein the secondary electron emission covering film is formed by sputtering.

3. The method according to claim 1, wherein the secondary electron emission covering film is formed by vapor deposition.

4. The method according to claim 1, wherein reactive gas is introduced into the chamber, and the noble metal adhered onto the inner wall surface of the chamber is chemically reacted with the reactive gas using plasma, whereby the secondary electron emission covering film is formed.

5. The method according to claim 4, wherein the reactive gas is oxygen gas or nitrogen gas.

6. The method according to claim 1, wherein the secondary electron emission covering film is formed at a predetermined interval based on a deposition amount of a film made of noble metal deposited on the inner wall surface of the chamber.

7. A method for continuously forming an electronic component comprising a film made of a noble metal as a member, wherein the film made of a noble metal is formed by the method for continuously forming a film made of a noble metal according to claim 1.

\* \* \* \* \*